US012669372B2

(12) United States Patent
Fan et al.

(10) Patent No.: US 12,669,372 B2
(45) Date of Patent: Jun. 30, 2026

(54) SINGLE-PHOTON DETECTION DEVICE AND SINGLE-PHOTON DETECTION METHOD

(71) Applicant: Beijing Academy of Quantum Information Sciences, Beijing (CN)

(72) Inventors: Yuanbin Fan, Beijing (CN); Zhiliang Yuan, Beijing (CN)

(73) Assignee: BEIJING ACADEMY OF QUANTUM INFORMATION SCIENCES, Beijing (CN)

( * ) Notice: Subject to any disclaimer, the term of this patent is extended or adjusted under 35 U.S.C. 154(b) by 408 days.

(21) Appl. No.: 18/253,452

(22) PCT Filed: Oct. 13, 2022

(86) PCT No.: PCT/CN2022/125141
§ 371 (c)(1),
(2) Date: May 18, 2023

(87) PCT Pub. No.: WO2024/016490
PCT Pub. Date: Jan. 25, 2024

(65) Prior Publication Data
US 2026/0118167 A1 Apr. 30, 2026

(30) Foreign Application Priority Data
Jul. 20, 2022 (CN) .......................... 202210862132.X

(51) Int. Cl.
G01J 1/44 (2006.01)
G01J 1/42 (2006.01)
(Continued)

(52) U.S. Cl.
CPC . G01J 1/44 (2013.01); G01J 1/42 (2013.01);
H03H 7/18 (2013.01); H03H 9/64 (2013.01);
(Continued)

(58) Field of Classification Search
CPC .. G01J 1/44; G01J 2001/442; G01J 2001/446;
G01J 1/42; H03H 7/18; H03H 9/64
See application file for complete search history.

(56) References Cited

U.S. PATENT DOCUMENTS 5,228,043 A * 7/1993 Naito ................... H04B 10/504
372/32
6,424,027 B1 * 7/2002 Lamson .............. H01L 23/3128
257/676
(Continued)

FOREIGN PATENT DOCUMENTS

CN 101650227 A 2/2010
CN 102230828 A 11/2011
(Continued)

OTHER PUBLICATIONS

Notice of Allowance issued on Feb. 20, 2025, in corresponding Chinese Application No. 202210862132.X, 3 pages.
(Continued)

*Primary Examiner* — Jennifer D Bennett
(74) *Attorney, Agent, or Firm* — Maier & Maier, PLLC

(57) ABSTRACT

A single-photon detection device including an interference unit. The interference unit includes: a signal dividing module configured to divide input signals into first signals and second signals; a first signal path coupled to the signal dividing module and configured to receive and transmit the first signals; a second signal path coupled to the signal dividing module and configured to receive the second signals and filter out and transmit signals with a preset frequency component; a phase shift module arranged in the first signal path or the second signal path and configured to shift the phase of transmission signals by 180 degrees; and a coupling module coupled to the first signal path and the second signal path and configured to receive output signals of the first signal path and the second signal path and then (Continued)

output after coupling. The single-photon detection device eliminates many gating interference signals, and optimizes other aspects.

16 Claims, 9 Drawing Sheets

(51) Int. Cl.
 *H03H 7/18* (2006.01)
 *H03H 9/64* (2006.01)

(52) U.S. Cl.
 CPC . *G01J 2001/442* (2013.01); *G01J 2001/4466* (2013.01)

(56) References Cited

U.S. PATENT DOCUMENTS

| | | | | |
|---|---|---|---|---|
| 6,452,714 B1* | 9/2002 | Rollins | G02F 2/00 | |
| | | | 359/278 | |
| 2005/0100351 A1 | 5/2005 | Yuan et al. | | |
| 2006/0034622 A1* | 2/2006 | Day | H03F 3/45179 | |
| | | | 398/208 | |
| 2006/0284783 A1* | 12/2006 | Mohamadi | H01Q 21/065 | |
| | | | 343/700 MS | |
| 2009/0039237 A1* | 2/2009 | Inoue | G01J 1/44 | |
| | | | 250/214 R | |
| 2009/0292196 A1* | 11/2009 | Eckert | A61B 5/05 | |
| | | | 600/407 | |
| 2010/0111305 A1 | 5/2010 | Yuan et al. | | |
| 2010/0294919 A1* | 11/2010 | Kardynal | H10F 30/225 | |
| | | | 250/214.1 | |
| 2011/0108712 A1* | 5/2011 | Thomas | G01J 1/44 | |
| | | | 250/214 R | |
| 2012/0104239 A1* | 5/2012 | Nishioka | G01J 1/44 | |
| | | | 250/214.1 | |
| 2012/0294625 A1 | 11/2012 | Dynes et al. | | |
| 2015/0034808 A1 | 2/2015 | Yuan et al. | | |

FOREIGN PATENT DOCUMENTS

| | | | | |
|---|---|---|---|---|
| CN | 107014495 A | | 8/2017 | |
| CN | 108072453 A | * | 5/2018 | G01J 11/00 |
| CN | 109270375 A | * | 1/2019 | G01R 31/00 |
| CN | 113708847 A | | 11/2021 | |
| GB | 2466299 A | | 6/2010 | |
| GB | 2466299 B | | 6/2012 | |
| JP | 04260213 A | * | 9/1992 | |
| JP | H04260213 A | | 9/1992 | |
| JP | H04279067 A | | 10/1992 | |
| JP | H0730144 A | | 1/1995 | |
| WO | 2007102430 A1 | | 9/2007 | |
| WO | 2024016490 A1 | | 1/2024 | |

OTHER PUBLICATIONS

Search Report issued on Feb. 20, 2025, in corresponding Chinese Application No. 202210862132.X, 6 pages.

International Search Report issued on Dec. 27, 2022, in corresponding International Application No. PCT/CN2022/125141, 8 pages.

Zhang et al. "Advances in InGaAs/InP single-photon detector systems for quantum communication", Light: Science & Applications, May 8, 2015, vol. 4, 13 pages.

Diamanti et al. "Practical challenges in quantum key distribution", NPJ Quantum Information, Nov. 8, 2016, vol. 2, No. 16025, 12 pages.

Extended Search Report issued on Aug. 27, 2025, in corresponding European Application No. 22951754.5, 11 pages.

Office Action issued on Oct. 7, 2025, in corresponding Japanese Application No. 2024-558378, 14 pages.

\* cited by examiner

<u>100</u>

<u>100</u>

<u>100</u>

100

200

200
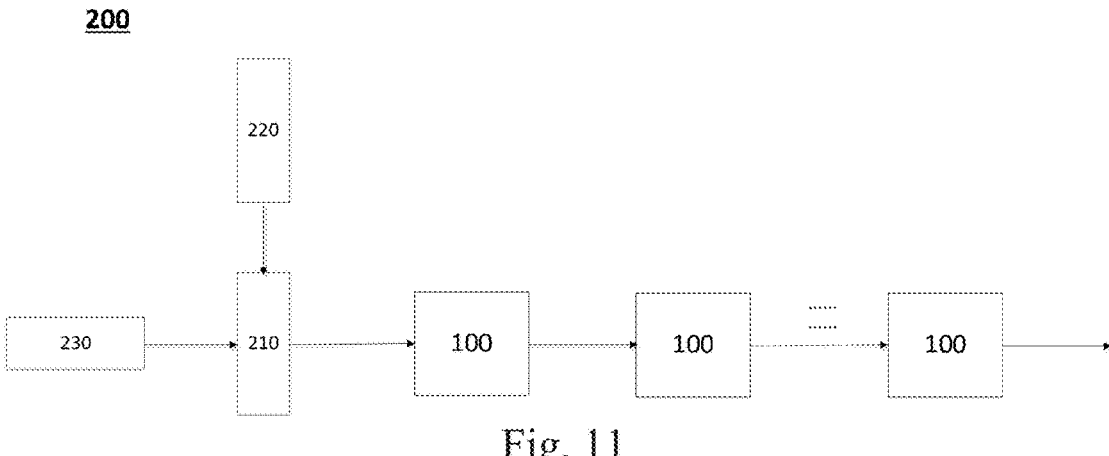
Fig. 11
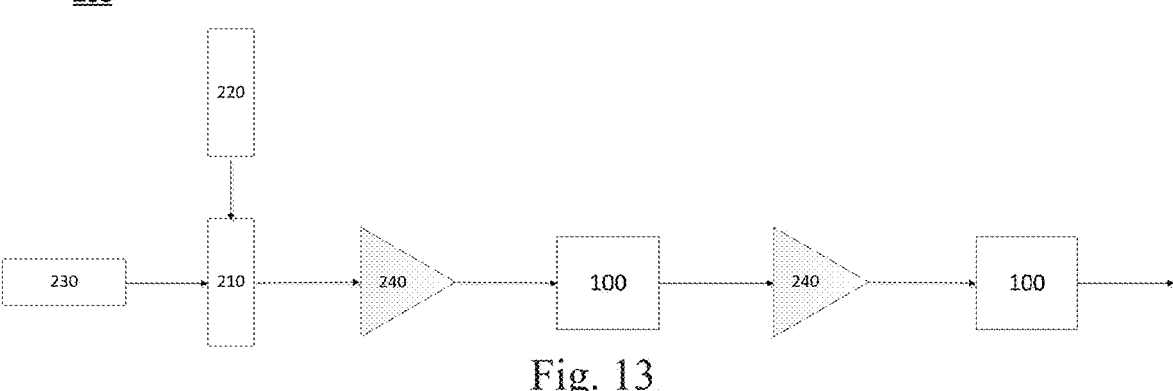
Time (ns)
Fig. 12
200
Fig. 13 single-photon detection method 10

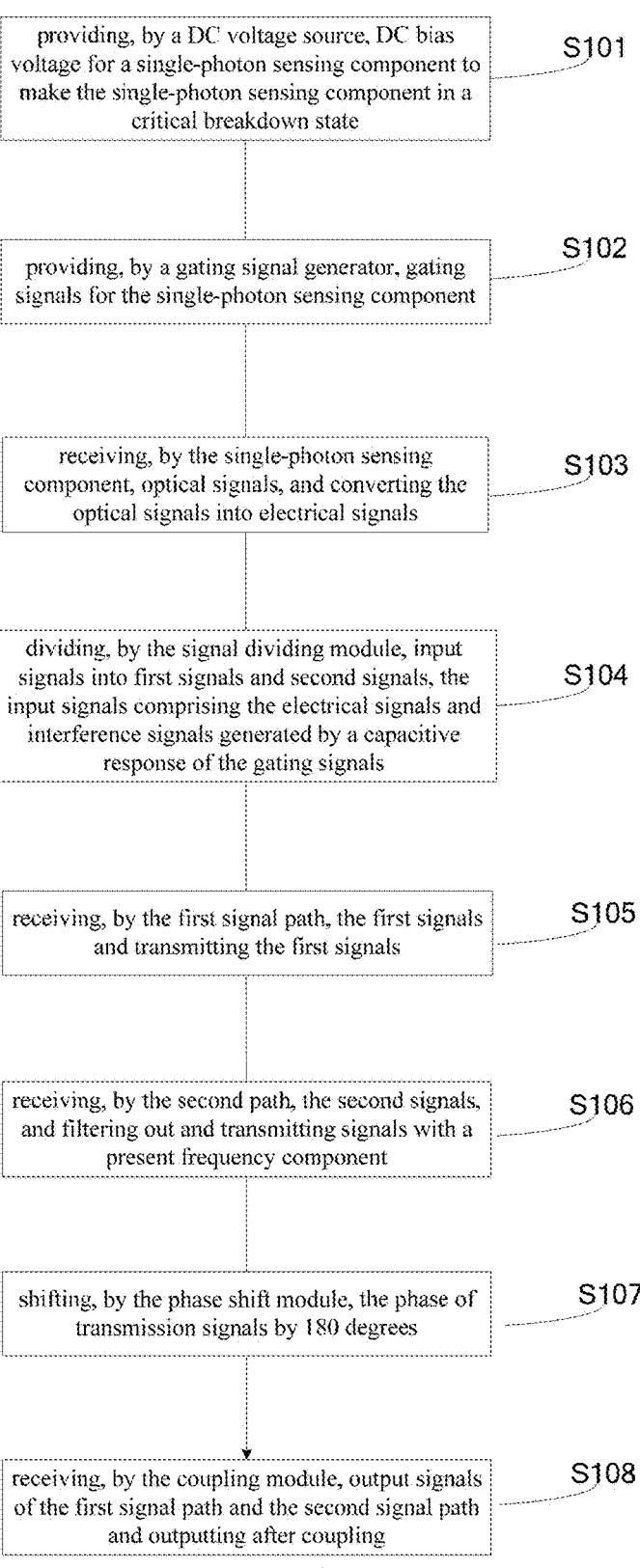

providing, by a DC voltage source, DC bias voltage for a single-photon sensing component to make the single-photon sensing component in a critical breakdown state    S101 providing, by a gating signal generator, gating signals for the single-photon sensing component    S102 receiving, by the single-photon sensing component, optical signals, and converting the optical signals into electrical signals    S103 dividing, by the signal dividing module, input signals into first signals and second signals, the input signals comprising the electrical signals and interference signals generated by a capacitive response of the gating signals    S104 receiving, by the first signal path, the first signals and transmitting the first signals    S105 receiving, by the second path, the second signals, and filtering out and transmitting signals with a present frequency component    S106 shifting, by the phase shift module, the phase of transmission signals by 180 degrees    S107 receiving, by the coupling module, output signals of the first signal path and the second signal path and outputting after coupling    S108

Fig. 15

SINGLE-PHOTON DETECTION DEVICE AND SINGLE-PHOTON DETECTION METHOD

TECHNICAL FIELD

The invention relates to the technical field of weak light detection, in particular to a single-photon detection device comprising an interference unit and a single-photon detection method using this single-photon detection device.

BACKGROUND

Due to the need for weak light sensing and detection in the fields of quantum key distribution, optical fiber sensing, optical fiber communication, laser radar, high-energy physics, semiconductor device characteristic analysis and biological imaging, single-photon detection devices based on semiconductor avalanche photodiodes (APD) have been widely used, among which the APDs used in optical fiber communication bands (1310 nm and 1550 nm) are mainly based on the InGaAs material.

In order to suppress the post-pulse noise of the single-photon detection device based on the InGaAs APD and improve the photon counting rate of the single-photon detection device, a gate drive mode is usually adopted for the APD to reduce the avalanche charge and the recovery time after an avalanche. A silicon-based APD can also adopt the gate drive mode. However, due to the parasitic capacitance of the APD and a circuit, the capacitive response of a gating signal will mask an avalanche signal caused by photons. Therefore, the capacitive response of the gating signal must be effectively eliminated.

In the prior art, there are technical schemes of active cancellation, band-stop filtering, low-pass filtering and self-differentiation. The active cancellation technology can effectively eliminate the fundamental frequency and higher harmonic frequency of the capacitive response of the gating signal at an output port of the APD, and has a wide and continuous frequency domain passband to process an avalanche narrow pulse signal. However, when the temperature and bias voltage of the APD change, the capacitive response of the gating signal at the output port of the APD will change accordingly. At this point, the active cancellation technology needs to be readjusted to eliminate a capacitive response signal of the gating signal at the output port of the APD, so the applicability of the active cancellation technology is limited.

The band-stop filtering technology uses multiple RF band-stop filters to suppress the fundamental frequency and higher harmonic frequency of the capacitive response of the gating signal at the output port of the APD. The band-stop bandwidth of the band-stop filters is generally 100-300 MHz, and there is a certain transition band. Although this scheme has a wide frequency domain passband to process the avalanche narrow pulse signal, frequency domain discontinuity is serious near the fundamental frequency and higher harmonic frequency points of the gating signal, which will reduce the signal-to-noise ratio of the avalanche narrow pulse signal, broaden and distort the pulse waveform to some extent, and increase the jitter.

The frequency domain passband used by the low-pass filtering scheme to process the avalanche narrow pulse signal is small, which generally does not exceed 90% of the frequency of the gating signal. The small frequency domain processing bandwidth will reduce the signal-to-noise ratio of the avalanche narrow pulse signal, broaden and distort the pulse waveform, and increase the jitter.

The self-differential technology requires both differential signal channels to transmit and process broadband signals, which requires high broadband performance of devices.

SUMMARY

In view of at least one defect of the prior art, the invention provides a single-photon detection device, which comprises an interference unit, wherein the interference unit comprises:

a signal dividing module configured to divide input signals into first signals and second signals;

a first signal path coupled to the signal dividing module and configured to receive and transmit the first signals;

a second signal path coupled to the signal dividing module and configured to receive the second signals and filter out and transmit signals with a preset frequency component from the second signals;

a phase shift module arranged in the first signal path or the second signal path and configured to shift a phase of transmitted signals by 180 degrees; and a coupling module coupled to the first signal path and the second signal path and configured to receive and couple output signals of the first signal path and the second signal path and output the coupled signals.

According to one aspect of the invention, a difference between transmission distances of the first signal path and the second signal path is less than a first preset value.

According to one aspect of the invention, the second signal path comprises:

a narrow band filtering module with a passband including the preset frequency component.

According to one aspect of the invention, the passband bandwidth of the narrow band filtering module is less than or equal to 10 MHz.

According to one aspect of the invention, the narrow band filtering module comprises one or more of a surface acoustic wave filter, a bulk acoustic wave filter and a dielectric filter.

According to one aspect of the invention, the first signal path comprises:

a power attenuation module configured to adjust a power of the first signal to make a power difference between the output signals of the first signal path and the second signal path less than a second preset value.

According to one aspect of the invention, the power attenuation module comprises one or more of an analog voltage-controlled attenuator, a numerical control step attenuator and a resistance network attenuator.

According to one aspect of the invention, the phase shift module is arranged on the second signal path.

According to one aspect of the invention, the phase shift module comprises one or more of an RF transmission line, an analog voltage-controlled phase shifter, a numerical control step phase shifter, a capacitance network phase shifter, an inductance network phase shifter and a capacitance-inductance hybrid network phase shifter.

According to one aspect of the invention, the signal dividing module and the coupling module each comprises a three-port RF matching component, which comprises a first end, a second end and a third end; the three-port RF matching component of the signal dividing module is configured as follows:

the first end is coupled to a single-photon sensing component and configured to receive the input signals;

the second end is coupled to the first signal path and configured to output the first signals; and the third end is coupled to the second signal path and configured to output the second signals;

wherein the three-port RF matching component of the coupling module is configured as follows:

the second end is coupled to the second signal path and configured to receive the output signals of the second signal path;

the third end is coupled to the first signal path and configured to receive the output signals of the first signal path; and the first end outputs signals formed by coupling the output signals of the first signal path and the output signals of the second signal path.

According to one aspect of the invention, the three-port RF matching component comprises a directional coupler, and a second end and a third end of the directional coupler have a preset signal isolation degree.

According to one aspect of the invention, the single-photon detection device further comprises:

a single-photon sensing component configured to receive optical signals and convert the optical signals into electrical signals;

a DC voltage source coupled to the single-photon sensing component and configured to provide DC bias voltage for the single-photon sensing component to make the single-photon sensing component in a critical break-down state; and a gating signal generator coupled to the single-photon sensing component and configured to provide gating signals for the single-photon sensing component;

wherein the input signals comprise the electrical signals and interference signals generated by a capacitive response of the gating signals.

According to one aspect of the invention, the gating signals comprise periodic signals, and the preset frequency component comprises one of the frequency components of the gating signals.

According to one aspect of the invention, the single-photon detection device comprises a plurality of the inter-ference units, wherein the plurality of interference units is cascaded, and the second signal path of each interference unit filters out interference signals corresponding to one of the frequency components of the gating signals.

According to one aspect of the invention, the single-photon detection device further comprises:

a plurality of signal amplification units, wherein each of the signal amplification units is arranged in front of one of the interference units in the transmission direction of the input signals and configured to amplify the input signals.

According to one aspect of the invention, the single-photon detection device further comprises:

a low-pass filtering unit arranged behind the plurality of interference units in the transmission direction of the input signals and configured to perform low-pass fil-tering on the output signals filtered by the plurality of interference units.

The invention further provides an integrated circuit chip, comprising the above single-photon detection device inte-grated thereon.

The invention further provides a single-photon detection method using the above single-photon detection device, comprising:

providing, by a DC voltage source, DC bias voltage for a single-photon sensing component so as to make the single-photon sensing component in a critical break-down state;

providing, by a gating signal generator, gating signals for the single-photon sensing component;

receiving optical signals, by the single-photon sensing component, and converting the optical signals into electrical signals;

dividing, by the signal dividing module, input signals into first signals and second signals, the input signals com-prising the electrical signals and interference signals generated by a capacitive response of the gating sig-nals;

receiving and transmitting the first signals, by the first signal path;

receiving the second signals, and filtering out and trans-mitting signals with a preset frequency component from the second signals, by the second signal path;

shifting, by the phase shift module, a phase of transmis-sion signals by 180 degrees; and receiving and coupling output signals of the first signal path and the second signal path, and outputting the coupled signals, by the coupling module.

According to one aspect of the invention, a difference between transmission distances of the first signal path and the second signal path is less than a first preset value.

According to one aspect of the invention, the second signal path comprises a narrow band filtering module with a passband including the preset frequency component, and the passband bandwidth of the narrow band filtering module is less than or equal to 10 MHz; and the method further comprises:

filtering, by the narrow band filtering module, the second signals.

According to one aspect of the invention, the first signal path comprises a power attenuation module, and the method further comprises:

adjusting, by the power attenuation module, a power of the first signal to make a power difference between the output signals of the first signal path and the second signal path less than a second preset value.

According to one aspect of the invention, the signal dividing module and the coupling module each comprises a three-port RF matching component, and the three-port RF matching component comprises a first end, a second end and a third end; the three-port matching component of the signal dividing module is configured as follows: the first end is coupled to a single-photon sensing component, the second end is coupled to the first signal path, and the third end is coupled to the second signal path; the three-port matching device of the coupling module is configured as follows: the second end is coupled to the second signal path, and the third end is coupled to the first signal path; and the method further comprises:

receiving, by the first end of the three-port RF matching component of the signal dividing module, the input signals;

outputting, by the second end of the three-port RF match-ing component of the signal dividing module, the first signals;

outputting, by the third end of the three-port RF matching component of the signal dividing module, the second signals;

receiving, by the second end of the three-port RF match-ing component of the coupling module, the output signals of the second signal path;

receiving, by the third end of the three-port RF matching component of the coupling module, the output signals of the first signal path; and outputting, by the first end of the three-port RF matching component of the coupling module, signals formed by coupling the output signals of the first signal path and the output signals of the second signal path.

According to one aspect of the invention, the single-photon detection device comprises a plurality of the interference units cascaded, the preset frequency component comprises one of the frequency components of the gating signals, and the method further comprises:

filtering out, by the second signal path of each interference unit, interference signals corresponding to one of the frequency components of the gating signals.

According to one aspect of the invention, the single-photon detection device further comprises a plurality of signal amplification units, each of the signal amplification units is arranged in front of one of the interference units in the transmission direction of the input signals, and the method further comprises:

amplifying, by the plurality of signal amplification units, the input signals.

According to one aspect of the invention, the single-photon detection device further comprises a low-pass filtering unit arranged behind the plurality of interference units in a transmission direction of the input signals, and the method further comprises:

performing, by the low-pass filtering unit, low-pass filtering on the output signals filtered by the plurality of interference units.

The invention further provides a non-transitory computer-readable storage medium having stored thereon computer-readable instructions which, when executed by a processor, cause the processor to execute the method as mentioned above.

According to the single-photon detection device comprising the interference unit, the integrated circuit chip and the single-photon detection method provided by the invention, an ultra-narrow band-pass filter is used for filtering to obtain fundamental or higher harmonic signal frequency components of gating interference signals, which then interfere with main transmission signals (including electrical signals after photoelectric conversion and gating interference signals) through the coupling module, and the interference phenomenon only occurs in a passband and transition band of the ultra-narrow band-pass filter in the whole frequency domain, so the influence on the main transmission signals is very small. Through multistage filtering, a large number of gating interference signals are effectively eliminated, a wide and continuous frequency domain passband can be stably provided to process avalanche narrow pulse signals, which has little influence on the signal-to-noise ratio, pulse waveform and jitter of the avalanche narrow pulse signals, and the detection efficiency, post-pulse effect and time resolution of the single-photon detection device are significantly optimized.

BRIEF DESCRIPTION OF THE DRAWINGS

In order to explain the technical solution in the embodiments of the application more clearly, the drawings used in the description of the embodiments will be briefly introduced below. Obviously, the drawings in the following description are only for some embodiments of the application. For those of ordinary skill in the art, other drawings can be obtained from these drawings without exceeding the protection scope of this application.

Figure 1:
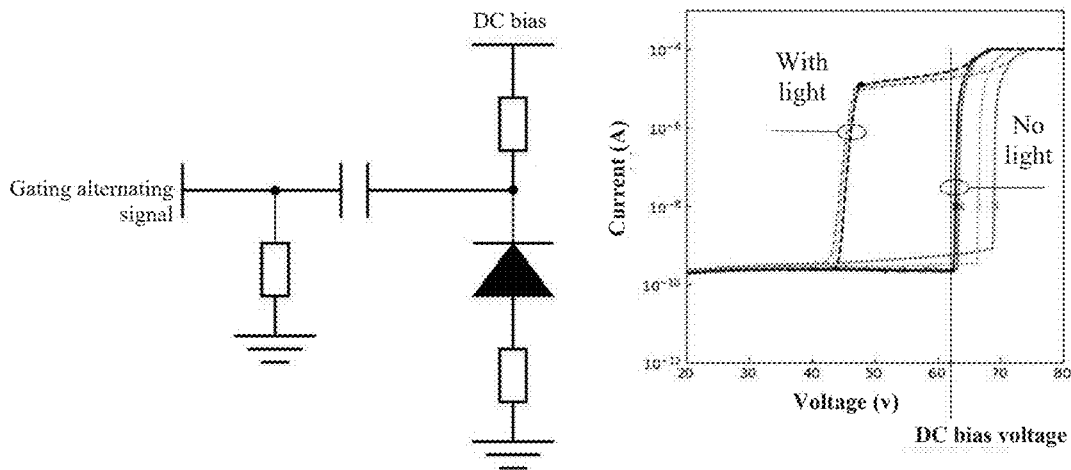
Figure 2:
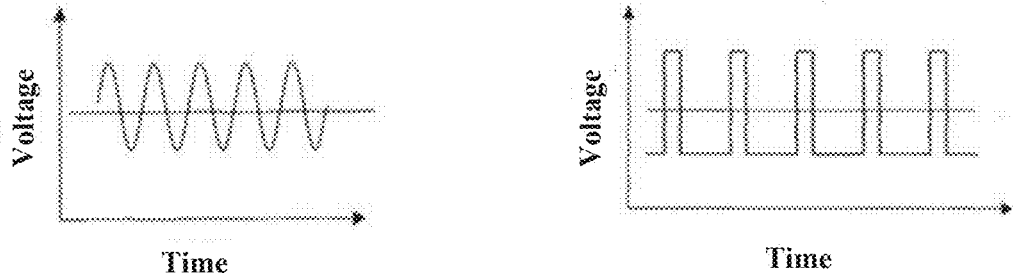
Figure 3:
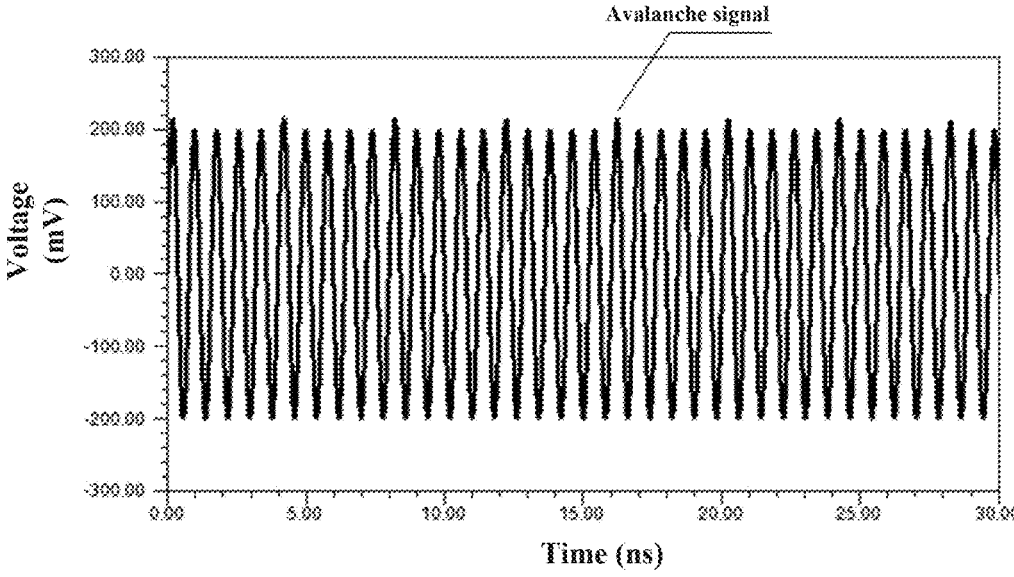
Figure 4:
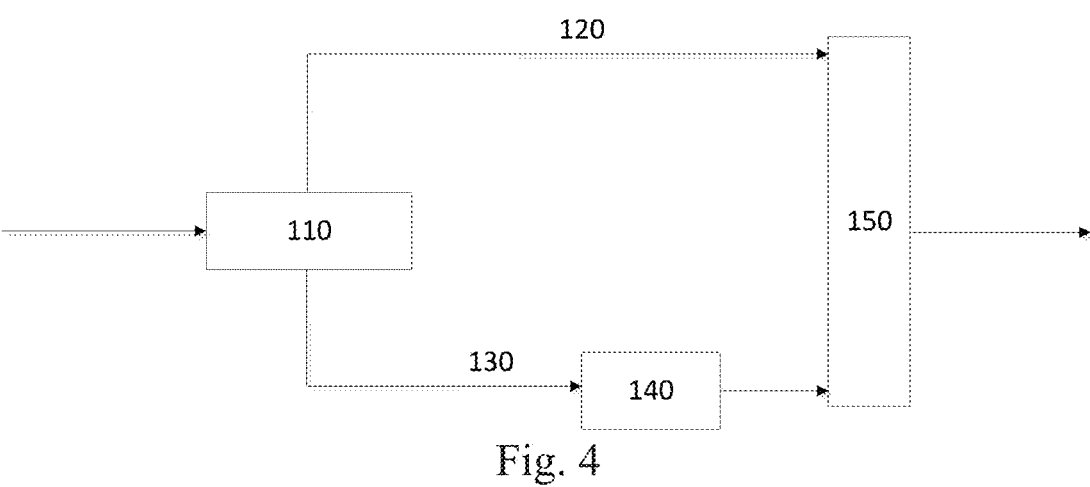
Figure 5:
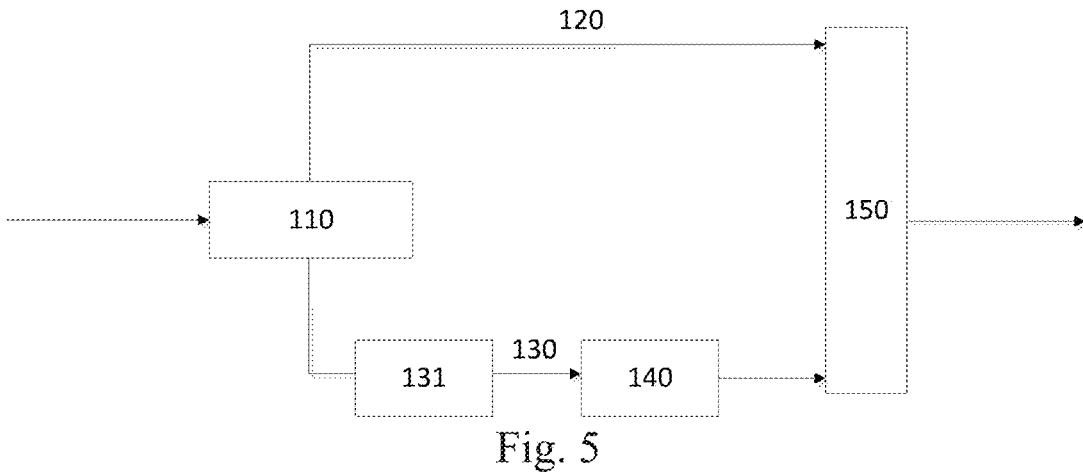
Figure 6:
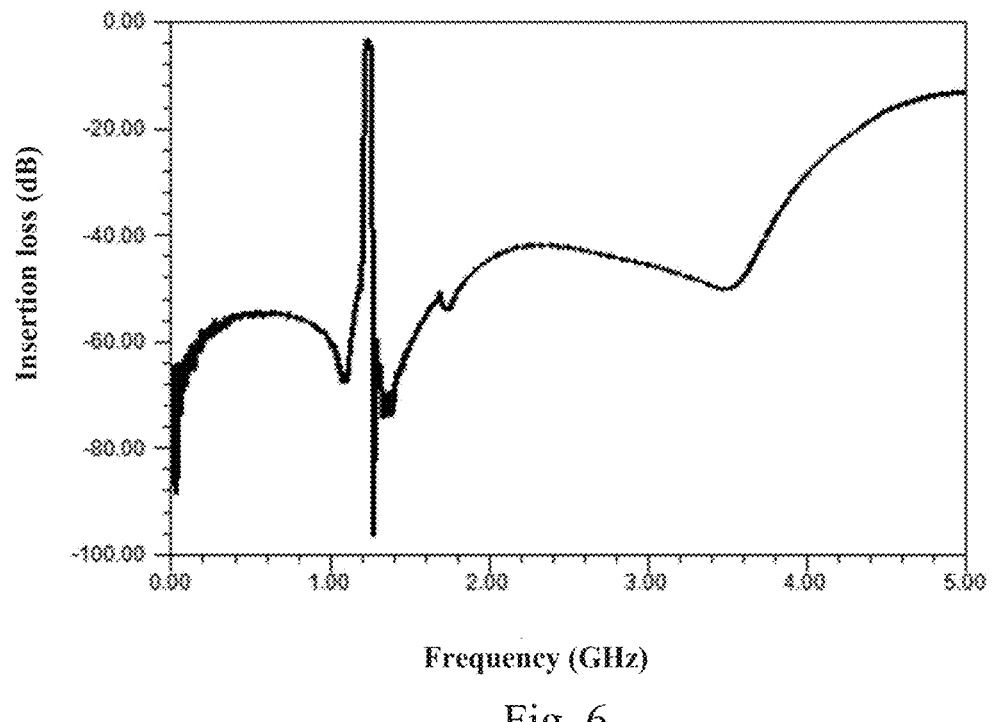
Figure 7:
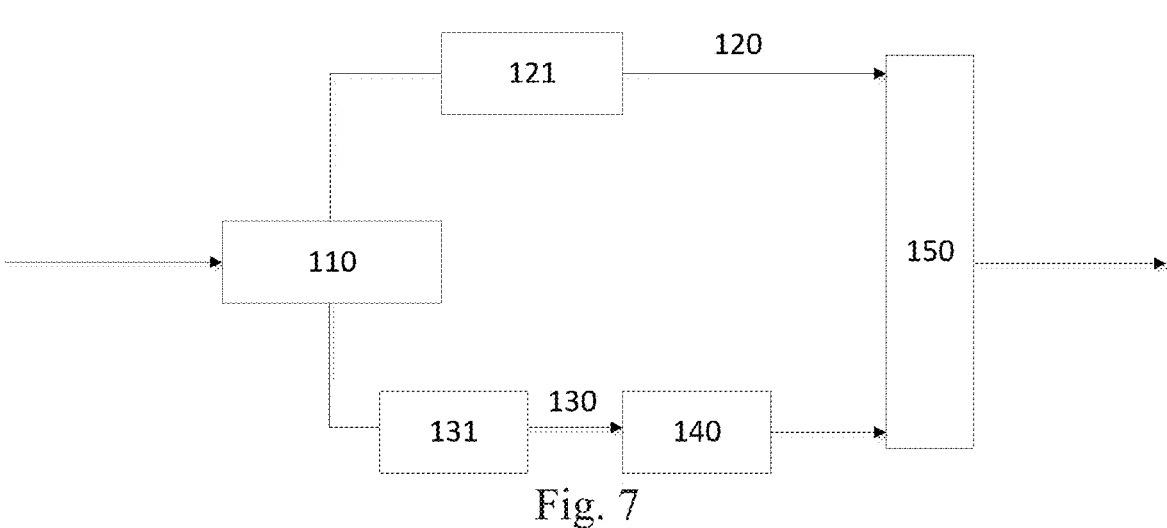
Figure 8:
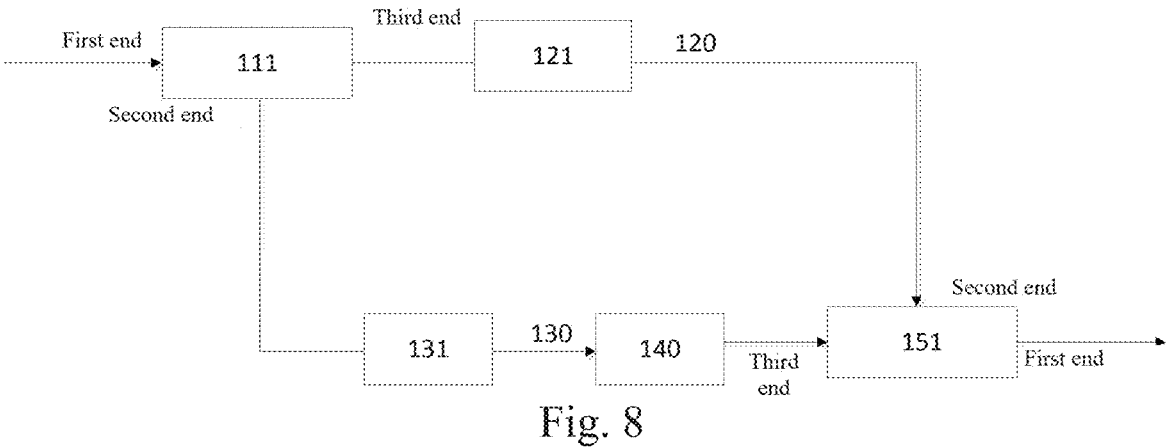
Figure 9:
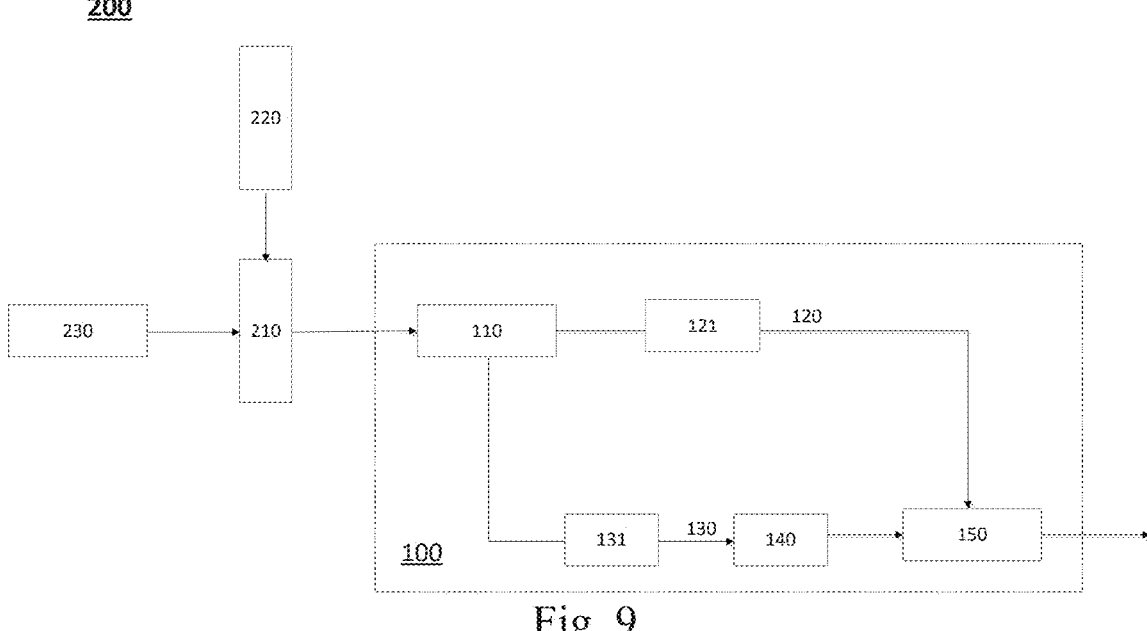
Figure 10A:
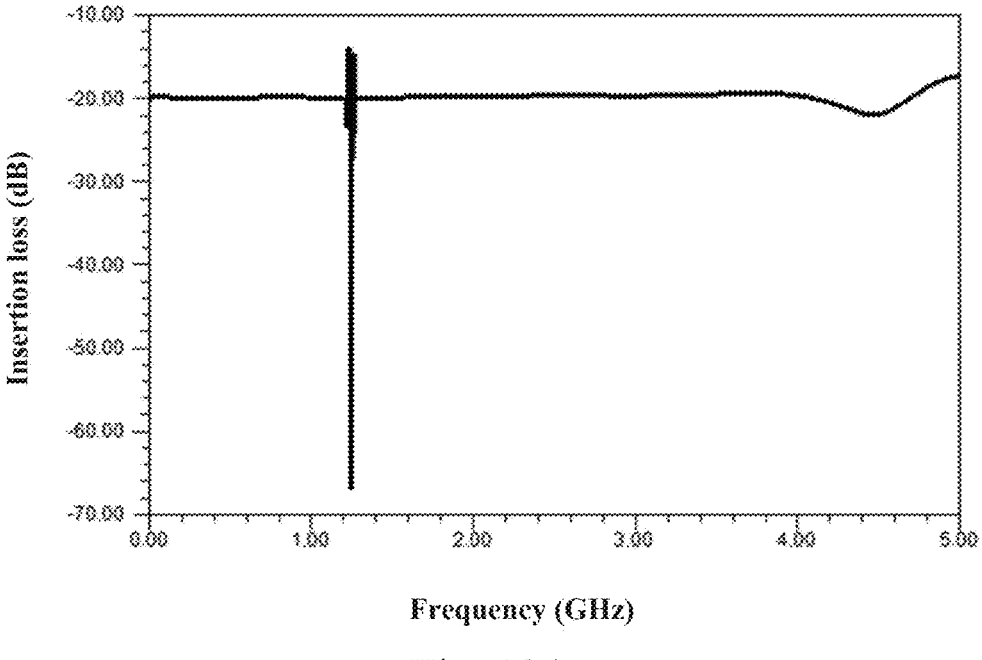
Figure 10B:
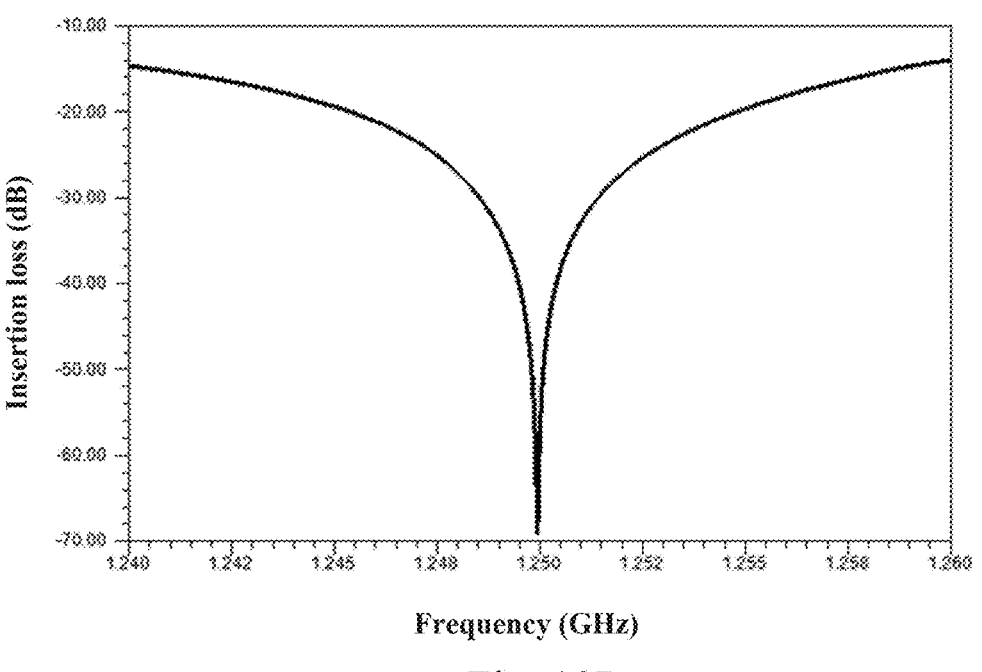
Figure 14:
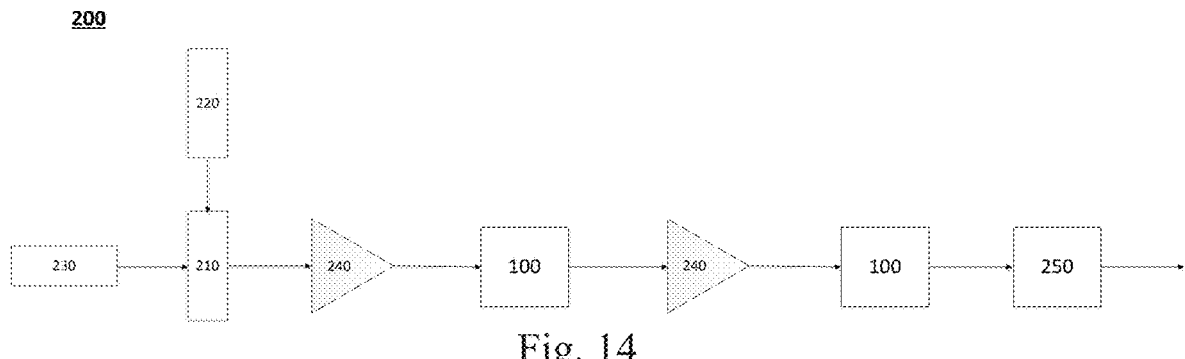
Figure 16A:
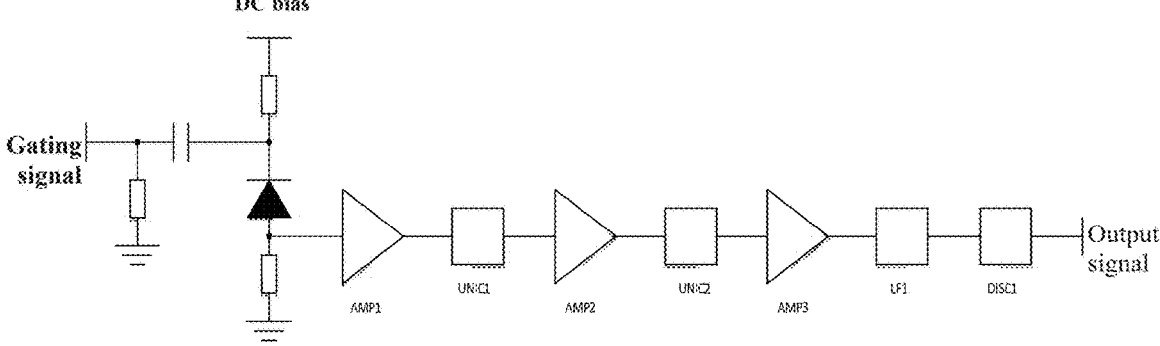
Figure 16B:
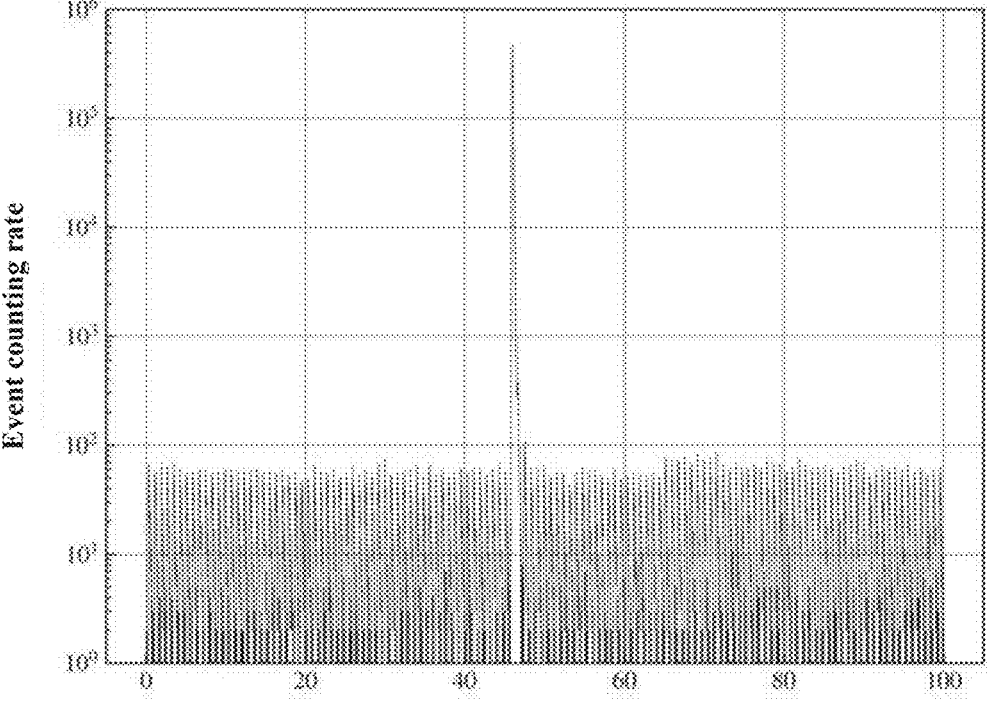

FIG. 1 shows a detection device comprising an APD and a volt-ampere characteristic curve thereof;

FIG. 2 shows a waveform of a gating voltage signal applied to an APD;

FIG. 3 shows an output signal waveform of a single-photon detection device in the prior art;

FIG. 4 shows an interference unit of a single-photon detection device provided by an embodiment of the invention;

FIG. 5 shows an interference unit of a single-photon detection device provided by an embodiment of the invention;

FIG. 6 shows a frequency response curve of an ultra-narrow band-pass filter in a single-photon detection device provided by an embodiment of the invention;

FIG. 7 shows an interference unit of a single-photon detection device provided by an embodiment of the invention;

FIG. 8 shows an interference unit of a single-photon detection device provided by an embodiment of the invention;

FIG. 9 shows a single-photon detection device comprising an interference unit provided by an embodiment of the invention;

FIG. 10A shows a frequency response curve of an interference unit of a single-photon detection device provided by an embodiment of the invention;

FIG. 10B shows a frequency response curve of an interference unit of a single-photon detection device provided by an embodiment of the invention;

FIG. 11 shows a single-photon detection device comprising an interference unit provided by an embodiment of the invention;

FIG. 12 shows an output signal waveform of a single-photon detection device comprising an interference unit provided by an embodiment of the invention;

FIG. 13 shows a single-photon detection device comprising an interference unit provided by an embodiment of the invention;

FIG. 14 shows a single-photon detection device comprising an interference unit provided by an embodiment of the invention;

FIG. 15 shows a single-photon detection method provided by an embodiment of the invention;

FIG. 16A shows a structural diagram of a single-photon detection device provided by an embodiment of the invention; and FIG. 16B shows a time distribution histogram of detection events of a single-photon detection device provided by an embodiment of the invention.

DETAILED DESCRIPTION OF EMBODIMENTS

The technical solution in the embodiments of the application will be described clearly and completely with reference to the drawings in the embodiments of the application. Obviously, the embodiments in the following description are merely illustrative ones, and are not all possible ones of the application. Based on the embodiments in the application, all other embodiments obtained by those skilled in the art without creative labor are within the scope of protection in the application.

The embodiments of the application have been introduced in detail above. Specific examples are applied herein to illustrate the principle and implementation of the application. The above embodiments are only used to help understand the method of the application and its core ideas. The changes or deformations made by those skilled in the art based on the ideas of the application and the specific implementation and application scope of the application are within the scope of protection of the application. To sum up, the content of this specification should not be construed as a limitation of the application.

Single-photon detection devices usually use an avalanche photodiode (APD) as a photoelectric sensing component. The working curve of the APD working under reverse bias voltage is shown in FIG. 1 (FIG. 1 shows a detection device comprising an APD and a working curve thereof). When there is no photon incidence, reverse current is extremely weak, thus being called dark current; and when there is photon incidence, a carrier pair (electron-hole pair) generated by light absorption will be separated by an electric field, resulting in reverse current, which is called photocurrent. In a linear working region, that is, when the reverse bias voltage of the APD is lower than breakdown voltage, the photocurrent is proportional to light intensity, and the APD does not have the function of single-photon detection at this point. However, when the bias voltage of the APD is higher than the breakdown voltage, carriers generated by a single photon are accelerated by the electric field to an energy level high enough to generate a new electron-hole pair by impact-ionization, thus realizing a continuous carrier multiplication effect (avalanche effect), to generate detectable macro current signals. Under high bias voltage, the APD is sensitive enough to sense optical signals at the single-photon level, thus being suitable for single-photon detection devices needed in fields like quantum key distribution and quantum direct communication.

The APD has a post-pulse effect, that is, within a period of time after an avalanche, the APD randomly produces a secondary avalanche without photon incidence. The post pulse is a kind of detector noise and should be suppressed as much as possible. The post pulse is related to avalanche current. The greater the avalanche current, that is, the higher the reverse bias voltage of the APD, the more significant the post pulse. In order to suppress the post pulse, the reverse bias voltage of the APD should not be set too high, because it will affect the single-photon detection efficiency of the APD. At the same time, APD detectors usually introduce a long dead time, that is, within a long period of time after successfully detecting a single-photon avalanche signal, photon counting is no longer carried out, so the detection counting rate of the single-photon detection device decreases. In order to improve the photon counting rate and detection efficiency of the single-photon detection device, a gate drive mode is often adopted for the APD. As shown in FIG. 1, DC bias voltage is applied to the APD to make it in a critical breakdown state, and on the basis of the DC bias voltage, periodically changing gating signals are applied to the APD. As shown in FIG. 2, optionally, the gating signals applied to the APD comprise periodic signals, such as one or more of sinusoidal signals, square wave signals and triangular wave signals (FIG. 2 shows waveforms of two gating signals). Within a certain time of the gating signals, the APD is in an avalanche breakdown state, and an avalanche can occur upon receiving optical signals at the single-photon level, and avalanche current is output; and during the remaining time of the gating signals, because the reverse bias voltage is lower than the breakdown voltage, the avalanche current will be quenched, thus reducing the avalanche charge and the recovery time after the avalanche. By applying the gating voltage signals, the post-pulse effect of the APD is effectively suppressed, and the photon counting rate and detection efficiency of the single-photon detection device are improved.

However, due to the parasitic capacitance of the APD and the circuit connected thereto, the capacitive response caused by gating signal injection will mask an avalanche signal caused by photons. As shown in FIG. 3, output signals of the APD comprise a large number of interference signals generated by the capacitive response of the gating signals, which makes electrical signals generated by incident conversion of optical signals difficult to read. Therefore, the interference signals introduced by the capacitive response of the gating signals must be effectively eliminated.

The invention provides a single-photon detection device comprising an interference unit. An ultra-narrow band interference circuit is adopted to eliminate a fundamental frequency component and a higher harmonic frequency component of interference signals generated by the capacitive response of gating signals at an output port of an APD. The passband bandwidth of the ultra-narrow band interference circuit is generally less than or equal to 10 MHz, and the transition band is generally less than 20 MHz, which is not affected by the working state of the APD component itself. A wide and continuous frequency domain passband can be stably provided to process avalanche narrow pulse signals, which has little influence on the signal-to-noise ratio, pulse waveform and jitter of the avalanche narrow pulse signals, and the detection efficiency, post-pulse effect and time resolution of the single-photon detection device are significantly optimized.

According to an embodiment of the invention, the invention provides a single-photon detection device comprising an interference unit 100. As shown in FIG. 4, the interference unit 100 comprises a signal dividing module 110, a first signal path 120, a second signal path 130, a phase shift module 140 and a coupling module 150.

The signal dividing module 110 is configured to divide input signals into first signals and second signals. Optionally, the signal dividing module 110 receives input signals of an APD, the input signals comprise electrical signals generated by the APD in response to incident photons and interference signals generated by the capacitive response of gating signals, and the frequency of the interference signals is the same as that of the gating signals. The signal dividing module 110 divides the input signals into the first signals and the second signals, and transmits the first signals and the second signals along the first signal path 120 and the second signal path 130 respectively.

The first signal path 120 is coupled to the signal dividing module 110 and configured to receive and transmit the first signals. Optionally, the signal dividing module 110 divides the input signals into the first signals and the second signals with approximately equal power. Both the first signals and the second signals output from the signal dividing module 110 comprise the electrical signals generated by the APD in response to the incident photons and the interference signals generated by the capacitive response of the gating signals, wherein the first signals are transmitted along the first signal path 120.

The second signal path 130 is coupled to the signal dividing module 110 and configured to receive the second signals, and filter out and transmit signals with a preset frequency. The second signals output from the signal dividing module 110 are transmitted along the second signal path 130. Optionally, the second signal path 130 comprises a narrow-band filtering module, and the signals of the preset frequency in the input signals are filtered out and transmitted by the narrow-band filtering module. The signals of the preset frequency correspond to one of the frequency components of the interference signals (hereinafter referred to as "gating interference signal") generated by the capacitive response of the gating signals. For example, if the gating signals are sinusoidal signals, the gating interference signals have one frequency component, and for another example, if the gating signals are square wave signals, the gating interference signals have multiple frequency components (Fourier expansion of the square wave signals involves signal components with multiple frequencies).

The phase shift module 140 is arranged on the first signal path 120 or the second signal path 130 and configured to shift the phase of transmission signals by 180 degrees. FIG. 4 shows an embodiment in which the phase shift module 140 is arranged on the second signal path 130, and the phase shift module 140 can also be arranged on the first signal path 120. These embodiments are all within the protection scope of the invention. In the embodiment shown in FIG. 4, the phase shift module 140 shifts the phase of the transmission signals of the second signal path 130, that is, the signals of the preset frequency, by 180 degrees, and the shifted signals continue to be transmitted along the second signal path 130.

The coupling module 150 is coupled to the first signal path 120 and the second signal path 130, and is configured to receive output signals of the first signal path 120 and the second signal path 130 and then output after coupling a. The first signal path 120 receives and transmits the first signals, and the first signals comprise the electrical signals generated by the APD in response to the incident photons and the interference signals generated by the capacitive response of the gating signals. Therefore, the transmission signals of the first signal path 120 comprise all frequency components of the electrical signals generated by the APD in response to the incident photons and the gating interference signals. The second signal path 130 receives the second signals, and filters out and transmits the signals with the preset frequency, and the preset frequency is one of the frequency components of the interference signals generated by the capacitive response of the gating signals, so the transmission signals of the second signal path 130 comprise one of the frequency components of the gating interference signals. The phase of the transmission signals is shifted by 180 degrees by the phase shift module 140. Assuming that the phase shift module 140 is arranged on the second signal path 130, the output signals of the second signal path 130 are frequency signals obtained after one of the frequency components of the gating interference signals shifted by 180 degrees. The output signals of the first signal path 120 are coupled to the output signals of the second signal path 130, the signals of the preset frequency components with a phase difference of 180° cancel each other out, and the coupling module 150 outputs full frequency domain signals after cancelling out the preset frequency component, that is, the coupling module 150 outputs the electrical signals generated by the APD in response to the incident photons, and the gating interference signals remaining after filtering out the signals of the preset frequency component. Optionally, when the gating signals are sinusoidal signals and the gating interference signals only comprise one frequency component, all the gating interference signals can be filtered out through one time of filtering by the interference unit 100.

According to an embodiment of the invention, in the interference unit 100 of the single-photon detection device, the difference between transmission distances of the first signal path 120 and the second signal path 130 is less than a first preset value. The signal dividing module 110 divides the input signals into the first signals and the second signals, wherein the first signals are transmitted along the first signal path 120 and the second signals are transmitted along the second signal path 130. When output from the signal dividing module 110, the first signals and the second signals have the same initial phase. During transmission, the phase changes of the first signals and the second signals depend on the signal transmission time and the control of a module with a phase shifting function. The transmission distances of the first signal path 120 and the second signal path 130 can be set to be equal, that is, the time required for the first signals to be transmitted along the first signal path 120 is the same as the time required for the second signals to be transmitted along the second signal path 130. Optionally, the signals with the preset frequency component are filtered out from the second signals by a narrow band filtering module, and then the signals with the preset frequency component are phase-shifted by 180 degrees by the phase shift module 140. The output signals of the first signal path 120 and the second signal path 130 both comprise the signals with the preset frequency component, and the phase difference of the signals with the preset frequency component when output from the first signal path and the second signal path is just 180 degrees, so that complete cancellation is realized. The difference between transmission distances of the first signal path 120 and the second signal path 130 is set to be less than the first preset value, so the first preset value is smaller, for example, when signal transmission distances of the first signal path 120 and the second signal path 130 are completely equal, the cancellation effect of the output signals is better.

According to an embodiment of the invention, as shown in FIG. 5, in the interference unit 100 of the single-photon detection device, the second signal path 130 further comprises a narrow band filtering module 131.

The passband bandwidth of the narrow band filtering module 131 is less than or equal to 10 MHz, and a passband of the narrow band filtering module 131 includes the preset frequency component.

According to an embodiment of the invention, the narrow band filtering module 131 comprises one or more of a surface acoustic wave filter, a bulk acoustic wave filter and a dielectric filter.

According to the single-photon detection device comprising the interference unit 100 provided by the above embodiments of the invention, an ultra-narrow band-pass filter is used for filtering to obtain fundamental or higher harmonic signal frequency components of the gating interference signals, which then interfere with main transmission signals (including the electrical signals after photoelectric conversion and the gating interference signals) through the coupling module, and the interference phenomenon only occurs in a passband and transition band of the ultra-narrow band-pass filter in the whole frequency domain, so the influence on the main transmission signals is very small. FIG. 6 is a frequency response curve of the ultra-narrow band-pass filter.

According to an embodiment of the invention, as shown in FIG. 7, in the interference unit 100 of the single-photon detection device, the first signal path 120 further comprises a power attenuation module 121.

The power attenuation module 121 is configured to adjust the power of the first signal so that the power difference between the output signals of the first signal path 120 and the second signal path 130 is less than a second preset value.

The narrow band filtering module 131 is arranged on the second signal path 130, and the narrow band filtering module 131 causes power loss of the transmission signals of the second signal path 130. The power attenuation module 121 is arranged in the first signal path 120 to correspond to the power loss caused by the narrow band filtering module 131 during narrow band filtering. The first signals are transmitted through the first signal path 120, and adjusted by the power attenuation module 121, resulting in certain power attenuation; and the second signals are transmitted through the second signal path 130, the signals with the preset frequency component are filtered out by the narrow band filtering module 131, and the filtered signals also have certain power attenuation. By adjusting the action range of the power attenuation module 121, the power difference between the output signals of the first signal path 120 and the second signal path 130 can be made to be less than a second preset value. The smaller the power difference between the output signals of the first signal path 120 and the second signal path 130, the better the filtering effect on the interference signals of the preset frequency component. For example, if the power of the output signals of the first signal path 120 and the power of the output signals of the second signal path 130 are equal, the signals of the preset frequency component have the same power and opposite phases, so that cancellation can be effectively realized.

According to an embodiment of the invention, the power attenuation module 121 of the interference unit 100 comprises one or more of an analog voltage-controlled attenuator (VCA), a numerical control step attenuator (DSA) and a resistance network attenuator (the attenuation value can be adjusted by selecting resistor parameters). The power attenuation module 121 has a wide working frequency band, is arranged on the first signal path 120, and performs effective signal attenuation in the frequency domain of the first signals (comprising the electrical signals generated by the APD in response to the incident photons and the interference signals generated by the capacitive response of the gating signals).

According to an embodiment of the invention, in the interference unit 100 of the single-photon detection device, the phase shift module 140 is arranged on the second signal path 130.

According to an embodiment of the invention, the phase shift module 140 in the interference unit 100 comprises one or more of an RF transmission line, an analog voltage-controlled phase shifter, a numerical control step phase shifter, a capacitance network phase shifter, an inductance network phase shifter and a capacitance-inductance hybrid network phase shifter.

The phase shift module 140 of the interference unit 100 changes the phase by adjusting the physical length or propagation coefficient of the RF transmission line, or modulates the phase by selecting capacitance/inductance parameters, or modulates the attenuation value by the analog voltage-controlled attenuator or the numerical control step attenuator. The phase shift module 140 comprises a capacitor or an inductor, or a RF transmission line of which the phase shift degree is frequency-dependent. Therefore, the phase shift module 140 is arranged at the output port of the narrow band filtering module 131 in the second signal path 130, and the working frequency band of the phase shift module 140 only needs to cover the working passband of the narrow band filtering module 131.

According to an embodiment of the invention, as shown in FIG. 8, the signal dividing module 110 and the coupling module 150 each comprise a three-port RF matching component (shown as the three-port RF matching component and the three-port RF matching component 151 in FIG. 8), and the three-port RF matching component comprises a first end, a second end and a third end.

The three-port matching component 111 of the signal dividing module 110 is configured as follows:
the first end is coupled to a single-photon sensing component and configured to receive the input signals;
the second end is coupled to the first signal path 120 and configured to output the first signals;
the third end is coupled to the second signal path 130 and configured to output the second signals; and
the three-port matching component 151 of the coupling module 150 is configured as follows:
the second end is coupled to the second signal path 130 and configured to receive the output signals of the second signal path 130;
the third end is coupled to the first signal path 120 and configured to receive the output signals of the first signal path 120; and
the output signals of the first signal path 120 and the output signals of the second signal path 130 are coupled in the three-port RF matching component 151, the signals of the preset frequency component are subjected to destructive interference, and the first end of the three-port RF matching component 151 outputs the coupled signals.

The three-port RF matching components in the signal dividing module 110 and the coupling module 150 are used symmetrically to eliminate the difference between the two signal paths caused by the imbalance between ports. For example, the second end of the three-port RF matching component 111 of the signal dividing module 110 is coupled to the first signal path 120 and configured to output the first signals, and the third end is coupled to the second signal path 130 and configured to output the second signals. Due to the difference between the second end and the third end of the three-port RF matching component 111, the power of the first signals and the power of the second signals output by the signal dividing module 110 are also different. In the coupling module 150, the coupling mode of the three-port RF matching component 151 is reverse to the coupling mode of the three-port RF matching component 111, that is, the second end of the three-port RF matching component 151 is coupled to the second signal path 130 and configured to receive the output signals of the second signal path 130, and the third end is coupled to the first signal path 120 for receiving the output signals of the first signal path 120. Because the second end and the third end of the three-port RF matching component 151 have the same difference, the signals transmitted through the first signal path 120 and the signals transmitted through the second signal path 130 can be subjected to power correction before coupling. In this way, the power difference between the signals transmitted through the first signal path 120 and the second signal path 130 is smaller than a preset value, and then the interference signals of the preset frequency are mostly eliminated after passing through the interference unit 100.

According to an embodiment of the invention, in the interference unit 100, the three-port RF matching component comprises a directional coupler, and a second end and a third end of the directional coupler have a preset signal isolation degree. The second end of the directional coupler of the signal dividing module 110 is coupled to the first signal path 120 and configured to output the first signals. The third end is coupled to the second signal path 130 and configured to output the second signals. The second end of the directional coupler of the coupling module 150 is coupled to the second signal path 130 and configured to receive the output signals of the second signal path 130. The third end is coupled to the first signal path 120 for receiving the output signals of the first signal path 120. The second end and the third end of the directional coupler have a preset isolation degree to reduce the reflection of signals transmitted in the first signal path 120 or the second signal path 130 into the second signal path 130 or the first signal path 120.

According to an embodiment of the invention, as shown in FIG. 9, the invention provides a single-photon detection device 200 comprising the above-mentioned interference unit 100, and the single-photon detection device 200 further comprises a single-photon sensing component 210, a DC voltage source 220 and a gating signal generator 230.

The single-photon sensing component 210 is configured to receive optical signals and convert the optical signals into electrical signals. Optionally, the single-photon sensing component 210 comprises an APD, which works under the reverse bias voltage. When there is no photon incidence, reverse current is extremely weak, thus being called dark current; and when there is photon incidence, reverse current increases rapidly, thus being called photocurrent. The greater the intensity of light, the greater the reverse current, that is, the APD converts optical signals into electrical signals to be output.

The DC voltage source 220 is coupled to the single-photon sensing component 210 and configured to provide DC bias voltage for the single-photon sensing component 210. The DC voltage source 220 applies the DC bias voltage to the single-photon sensing component 210 to make the single-photon sensing component in a critical breakdown state.

The gating signal generator 230 is coupled to the single-photon sensing component 210 and configured to provide gating signals for the single-photon sensing component 210. On the basis of applying the DC bias voltage, the gating signal generator 230 applies periodically changing gating signals to the single-photon sensing component 210. Optionally, the gating signals applied by the gating signal generator 230 to the single-photon sensing component 210 comprise periodic signals, such as one or more of sinusoidal signals, square wave signals and triangular wave signals. Within a half period of the gating signals, the single-photon sensing component 210 is in an avalanche breakdown state, and an avalanche can occur upon receiving optical signals at the single-photon level, and avalanche current is output; and within the other half period of the gating signals, the single-photon sensing component 210 cannot respond to the incident optical signals, thus reducing the avalanche charge and the recovery time after the avalanche.

The interference unit 100 receives the input signals, and the input signals comprise the electrical signals generated after photoelectric conversion by the single-photon sensing component 210 and the interference signals generated by the capacitive response of the gating signals.

According to an embodiment of the invention, the gating signals mentioned above comprise periodic signals, such as one or more of sinusoidal signals, square wave signals and triangular wave signals. The second signal path 130 filters out and transmits the signals of the preset frequency component in the input signals through the narrow band filtering module 131, and the signals of the preset frequency component correspond to one of the frequency components of the interference signals generated by the capacitive response of the gating signals. For example, if the gating signals are sinusoidal signals, the gating interference signals have one frequency component, and for another example, if the gating signals are square wave signals, the gating interference signals have multiple frequency components (Fourier expansion of the square wave signals involves signal components with multiple frequencies).

The typical frequency response curves of the interference unit 100 of the single-photon detection device provided by the above embodiments of the invention are shown in FIGS. 10A and 10B. FIG. 10B is a coordinate axis Zoom In effect diagram of FIG. 10A. It can be seen that the interference phenomenon occurs in the passband and transition band of the ultra-narrow band-pass filter, and has little influence on the output signals seeing from the whole frequency domain.

According to an embodiment of the invention, as shown in FIG. 11, the invention provides a single-photon detection device 200, which comprises a plurality of the above-mentioned interference units 100.

The plurality of interference units 100 are cascaded, and the second signal path 130 of each interference unit 100 filters out signals corresponding to one of the frequency components of the gating signals.

By arranging the plurality of interference units 100, multiple frequency components in the gating interference signals can be filtered out one by one.

The gating signals, whether they are sinusoidal waves, square waves, triangular waves or other periodic signal waveforms, are a linear combination of fundamental frequency components and higher harmonic frequency components. By configuring the working frequency and number of the interference units 100, for example, making two interference units 100 work at the fundamental frequency of the gating signals, one interference unit 100 work at the second harmonic frequency of the gating signals and one interference unit 100 work at the third harmonic frequency of the gating signals, most of the gating interference signals can be filtered out.

FIG. 12 shows a signal waveform output by the single-photon detection device 200 comprising the interference units 100 provided by the invention after the gating interference signals are filtered out by the plurality of interference units 100. Compared with the signal waveform in FIG. 3, the electric signals generated by the single-photon sensing component 210 in response to photon incidence are easy to read.

According to an embodiment of the invention, as shown in FIG. 13, the single-photon detection device 200 provided by the invention further comprises:

a plurality of signal amplification units 240. Each signal amplification unit 240 is arranged in front of one of the interference units 100 along the transmission direction of the input signals, and configured to amplify the input signals. The signals input to the interference units 100 are preprocessed to prepare for the subsequent narrow-band filtering. FIG. 13 shows that the single-photon detection device 200 comprises two interference units 100, and an amplification unit 240 is arranged in front of each interference unit 100 along the transmission direction of the input signals. Those skilled in the art can easily understand that the single-photon detection device 200 may comprise more or fewer interference units 100, which correspond to more or fewer amplification units 240. The single-photon detection device 200 may also comprise a primary interference unit 100 and an amplification unit 240 arranged in front of the primary interference unit 100 along the transmission direction of the input signals. All the above variations are within the protection scope of the invention.

According to an embodiment of the invention, as shown in FIG. 14, the single-photon detection device 200 provided by the invention further comprises a low-pass filtering unit 250.

The low-pass filtering unit 250 is arranged behind the plurality of interference units 100 along the transmission direction of the input signals, and is configured to perform low-pass filtering on the output signals filtered by the plurality of interference units 100. FIG. 14 shows that the single-photon detection device 200 comprises two interference units 100, and the low-pass filtering unit 250 is arranged after the two interference units 100 in the transmission direction of the input signals. Those skilled in the art can easily understand that the single-photon detection device may comprise more or fewer interference units 100.

As mentioned above, in an embodiment, by making two interference units 100 work at the fundamental frequency of the gating signals, one interference unit 100 works at the second harmonic frequency of the gating signals and one interference unit 100 works at the third harmonic frequency of the gating signals, most of the gating interference signals can be filtered out. The low-pass filtering unit 250 is arranged after the fourth interference units 100, and the working frequency of the low-pass filtering unit 250 can be slightly lower than the fourth harmonic frequency of the gating signals, so as to further filter out the fourth harmonic frequency component in the gating interference signals.

According to an embodiment of the invention, in the single-photon detection device 200, the number and parameters of the signal amplification unit 240 and the low-pass filtering unit 250 can be configured according to actual requirements.

According to an embodiment of the invention, the invention also provides an integrated circuit chip on which the single-photon detection device provided in one or more of the above embodiments is integrated.

According to an embodiment of the invention, as shown in FIG. 15, the invention also provides a single-photon detection method 10 using the single-photon detection device provided in one or more of the above embodiments, comprising steps S101 to S108.

S101, providing, by a DC voltage source, DC bias voltage for a single-photon sensing component to make the single-photon sensing component in a critical breakdown state;

S102, providing, by a gating signal generator, gating signals for the single-photon sensing component;

S103, receiving optical signals, and converting the optical signals into electrical signals, by the single-photon sensing component;

S104, dividing, by the signal dividing module, input signals into first signals and second signals, the input signals comprising the electrical signals and interference signals generated by a capacitive response of the gating signals;

S105, receiving the first signals and transmitting the first signals, by the first signal path;

S106, receiving the second signals, and filtering out and transmitting signals with a preset frequency component, by the second path;

S107, shifting, by the phase shift module, the phase of transmission signals by 180 degrees; and S108, receiving output signals of the first signal path and the second signal path and outputting after coupling, by the coupling module.

According to an embodiment of the invention, in the single-photon detection method 10, the difference between transmission distances of the first signal path and the second signal path is less than a first preset value.

According to an embodiment of the invention, in the single-photon detection method 10, the second signal path comprises a narrow band filtering module, a passband of the narrow band filtering module includes the preset frequency component, and the passband bandwidth of the narrow band filtering module is less than or equal to 10 MHz; and the method 10 further comprises:

filtering, by the narrow band filtering module, the second signals.

According to an embodiment of the invention, in the single-photon detection method 10, the first signal path comprises a power attenuation module, and the method 10 further comprises:

adjusting, by the power attenuation module, the power of the first signal to make the power difference between the output signals of the first signal path and the second signal path less than a second preset value.

According to an embodiment of the invention, in the single-photon detection method 10, the signal dividing module and the coupling module each comprise a three-port RF matching component, and the three-port RF matching component comprises a first end, a second end and a third end; the three-port matching component of the signal dividing module is configured as follows: the first end is coupled to a single-photon sensing component, the second end is coupled to the first signal path, and the third end is coupled to the second signal path; the three-port matching device of the coupling module is configured as follows: the second end is coupled to the second signal path, and the third end is coupled to the first signal path; and the method 10 further comprises:

receiving, by the first end of the three-port RF matching component of the signal dividing module, the input signals;

outputting, by the second end of the three-port RF matching component of the signal dividing module, the first signals;

outputting, by the third end of the three-port RF matching component of the signal dividing module, the second signals;

receiving, by the second end of the three-port RF matching component of the coupling module, the output signals of the second signal path;

receiving, by the third end of the three-port RF matching component of the coupling module, the output signals of the first signal path; and outputting, by the first end of the three-port RF matching component of the coupling module, signals formed after coupling the output signals of the first signal path and the output signals of the second signal path.

According to an embodiment of the invention, in the single-photon detection method 10, the single-photon detection device further comprises a plurality of the interference units which are cascaded, the preset frequency component comprises one of the frequency components of the gating signals, and the method 10 further comprises:

filtering out, by the second signal path of each interference unit, interference signals corresponding to one of the frequency components of the gating signals.

According to an embodiment of the invention, in the single-photon detection method 10, the single-photon detection device further comprises a plurality of signal amplification units, each of the signal amplification units is arranged in front of one of the interference units in the transmission direction of the input signals, and the method 10 further comprises:

amplifying, by the plurality of signal amplification units, the input signals.

According to an embodiment of the invention, in the single-photon detection method 10, the single-photon detection device further comprises a low-pass filtering unit arranged behind the plurality of interference units in the transmission direction of the input signals, and the method 10 further comprises:

performing, by the low-pass filtering unit, low-pass filtering on the output signals filtered by the plurality of interference units.

The specific definition of the single-photon detection method 10 is similar to that of the above-mentioned single-photon detection device comprising the interference unit 100. Please refer to the introduction of the single-photon detection device comprising the interference unit 100 above, which is not repeated here.

The single-photon detection device comprising the interference unit 100 and the single-photon detection method 10 provided by the invention are verified by experimental verification below.

Experiment 1: An APD serves as the single-photon sensing component, the gating signals are square wave signals of 1.25 GHz, and four interference units are provided. The working frequency of two interference units is 1.25 GHz, the working frequency of one interference unit is 2.5 GHz and the working frequency of one interference unit is 3.75 GHz. The low-pass filter unit is arranged behind the four interference units, and the working frequency is 4.5 GHz. A resistance network serves as the attenuation module, a capacitance network serves as the phase shift module, a surface acoustic wave filter (SAW) serves as the narrow-band filter module, and directional couplers serve as the signal dividing module and the coupling module.

Experiment 2: An APD serves as the single-photon sensing component, the gating signals are sinusoidal wave signals of 1.25 GHz, and two interference units are provided. The working frequency of the two interference units is 1.25 GHz. The low-pass filter unit is arranged behind the two interference units, and the working frequency is 2.1 GHZ. A surface acoustic wave filter (SAW) serves as the narrow-band filter module, a coaxial resistance network attenuator serves as the attenuation module, and an RF transmission line with an appropriate length serves as the phase shift module.

The experimental results of the two experiments show that a large number of the gating interference signals are filtered out, the electrical signals after photoelectric conversion can be effectively extracted, and the post-pulse effect, time resolution and photon counting rate are significantly optimized in the overall frequency range.

FIG. 16A shows a structural diagram of the device used in Experiment 2, where the gating signals are sinusoidal wave signals of 1.25 GHZ, UNIC1 is the first interference unit with a working frequency of 1.25 GHz, and UNIC2 is the second interference unit with a working frequency of 1.25 GHz; AMP1 and AMP2 are signal amplifiers respectively arranged in front of the interference units UNIC1 and UNIC2 in the signal transmission direction, LF1 is the low-pass filter arranged behind the interference unit UNIC2 along the signal transmission direction, and the working frequency is 2.1 GHz; in the signal transmission direction, the signal amplifier AMP3 is arranged in front of the low-pass filter LF1; and a high-speed discriminator DISC1 is arranged behind the low-pass filter LF1 to discriminate and output the output signals.

FIG. 16B shows a time distribution histogram of detection events of the single-photon detection device in Experiment 2, where the detection efficiency is 29%, the post pulse is 1.3%, the dark count rate is 3 kcps, and the temperature is 263 K, respectively. The peak value of each counting gate in the figure is steep, which indicates that this device has good time resolution.

The invention further provides a non-transitory computer-readable storage medium having stored thereon computer-readable instructions which, when executed by a processor, cause the processor to execute the method 10 as described in the above one or more embodiments.

According to the single-photon detection device comprising the interference unit, the electric chip and the single-photon detection method provided by the invention, an ultra-narrow band-pass filter is used for filtering to obtain fundamental or higher harmonic signal frequency components of gating interference signals, which then interfere with main transmission signals (including electrical signals after photoelectric conversion and gating interference signals) through the coupling module, and the interference phenomenon only occurs in a passband and transition band of the ultra-narrow band-pass filter in the whole frequency domain, so the influence on the main transmission signals is very small. Through multistage filtering, a large number of gating interference signals are effectively eliminated, a wide and continuous frequency domain passband can be stably provided to process avalanche narrow pulse signals, which has little influence on the signal-to-noise ratio, pulse waveform and jitter of the avalanche narrow pulse signals, and the detection efficiency, post-pulse effect and time resolution of the single-photon detection device are significantly optimized.

What is claimed is:

1. A single-photon detection device, comprising a plurality of interference units, wherein each of the plurality of interference units comprises:

a signal divider configured to divide input signals into first signals and second signals, wherein the input signals comprise electrical signals generated by a single-photon sensor in response to incident photons and interference signals generated by a capacitive response of gating signals, and both the first signals and the second signals comprise the electrical signals and the interference signals;

a first signal path coupled to the signal divider and configured to receive and transmit the first signals;

a second signal path coupled to the signal divider and configured to receive the second signals and filter out and transmit signals with a preset frequency component from the second signals, wherein the second signal path comprises a narrow band filter with a passband including the preset frequency component;

an independent phase shifter arranged in the second signal path and configured to shift a phase of the transmitted signals by 180 degrees, wherein the phase shifter comprises one or more of an RF transmission line, an analog voltage-controlled phase shifter, a numerical control step phase shifter, a capacitance network phase shifter, an inductance network phase shifter and a capacitance-inductance hybrid network phase shifter; and a coupler coupled to the first signal path and the second signal path and configured to receive and couple output signals of the first signal path and the second signal path and output the coupled signals;

wherein the plurality of interference units is cascaded, and the second signal path of each of the interference units filters out the interference signals corresponding to one of the frequency components of the gating signals.

2. The single-photon detection device according to claim 1, wherein a difference between transmission distances of the first signal path and the second signal path is less than a first preset value.

3. The single-photon detection device according to claim 1, wherein the passband bandwidth of the narrow band filter is less than or equal to 10 MHz, and the narrow band filter comprises one or more of a surface acoustic wave filter, a bulk acoustic wave filter and a dielectric filter.

4. The single-photon detection device according to claim 1, wherein the first signal path comprises:

a power attenuator configured to adjust a power of the first signal to make a power difference between the output signals of the first signal path and the second signal path less than a second preset value, wherein the power attenuator comprises one or more of an analog voltage-controlled attenuator, a numerical control step attenuator and a resistance network attenuator.

5. The single-photon detection device according to claim 1, wherein the signal divider and the coupler each comprises a three-port RF matcher, and the three-port RF matcher comprises a first end, a second end and a third end; the three-port RF matcher of the signal divider is configured as follows:

the first end is coupled to the single-photon sensor and configured to receive the input signals;

the second end is coupled to the first signal path and configured to output the first signals; and the third end is coupled to the second signal path and configured to output the second signals;

wherein the three-port RF matcher of the coupler is configured as follows:

the second end is coupled to the second signal path and configured to receive the output signals of the second signal path;

the third end is coupled to the first signal path and configured to receive the output signals of the first signal path; and the first end outputs signals formed by coupling the output signals of the first signal path and the output signals of the second signal path.

6. The single-photon detection device according to claim 5, wherein the three-port RF matcher comprises a directional coupler, and a second end and a third end of the directional coupler have a preset signal isolation degree.

7. The single-photon detection device according to claim 1, further comprising:

the single-photon sensor configured to receive the incident photons and convert the incident photons into the electrical signals;

a DC voltage source coupled to the single-photon sensor and configured to provide DC bias voltage for the single-photon sensor to make the single-photon sensor in a critical breakdown state; and a gating signal generator coupled to the single-photon sensor and configured to provide the gating signals for the single-photon sensor.

8. The single-photon detection device according to claim 7, wherein the gating signals comprise periodic signals, and the preset frequency component comprises one of the frequency components of the gating signals.

9. The single-photon detection device according to claim 1, further comprising:

a plurality of signal amplifiers, wherein each of the signal amplifiers is arranged in front of one of the interference units in a transmission direction of the input signals and configured to amplify the input signals; and a low-pass filter arranged behind the plurality of interference units in the transmission direction of the input signals and configured to perform low-pass filtering on the output signals filtered by the plurality of interference units.

10. An integrated circuit chip, comprising the single-photon detection device according to claim 1 integrated thereon.

11. A method for single-photon detection using the single-photon detection device according to claim 1, comprising:

providing, by a DC voltage source, DC bias voltage for the single-photon sensor so as to make the single-photon sensor in a critical breakdown state;

providing, by a gating signal generator, the gating signals for the single-photon sensor;

receiving the incident photons and converting the incident photons into the electrical signals, by the single-photon sensor;

dividing, by the signal divider, the input signals into the first signals and the second signals, the input signals comprising the electrical signals and the interference signals generated by the capacitive response of the gating signals;

receiving and transmitting the first signals, by the first signal path;

receiving the second signals, and filtering out and transmitting signals with the preset frequency component from the second signals, by the second signal path;

shifting, by the phase shifter, the phase of transmission signals by 180 degrees; and receiving and coupling output signals of the first signal path and the second signal path, and outputting the coupled signals, by the coupler;

wherein the single-photon detection device comprises the plurality of interference units cascaded, the preset frequency component comprises one of the frequency components of the gating signals, and the method further comprises:

filtering out, by the second signal path of each of the interference units, the interference signals corresponding to one of the frequency components of the gating signals.

12. The method according to claim 11, wherein a difference between transmission distances of the first signal path and the second signal path is less than a first preset value.

13. The method according to claim 11, wherein the second signal path comprises the narrow band filter with a passband including the preset frequency component, and the passband bandwidth of the narrow band filter is less than or equal to 10 MHz; and the method further comprises:

filtering, by the narrow band filter, the second signals.

14. The method according to claim 11, wherein the first signal path comprises a power attenuator, and the method further comprises:

adjusting, by the power attenuator, a power of the first signal to make a power difference between the output signals of the first signal path and the second signal path less than a second preset value.

15. The method according to claim 11, wherein the signal divider and the coupler each comprises a three-port RF matcher, and the three-port RF matcher comprises a first end, a second end and a third end; the three-port matcher of the signal divider is configured as follows: the first end is coupled to the single-photon sensor, the second end is coupled to the first signal path, and the third end is coupled to the second signal path; the three-port matching device of the coupler is configured as follows: the second end is coupled to the second signal path, and the third end is coupled to the first signal path; and the method further comprises:

receiving, by the first end of the three-port RF matcher of the signal divider, the input signals;

outputting, by the second end of the three-port RF matcher of the signal divider, the first signals;

outputting, by the third end of the three-port RF matcher of the signal divider, the second signals;

receiving, by the second end of the three-port RF matcher of the coupler, the output signals of the second signal path;

receiving, by the third end of the three-port RF matcher of the coupler, the output signals of the first signal path; and outputting, by the first end of the three-port RF matcher of the coupler, signals formed by coupling the output signals of the first signal path and the output signals of the second signal path.

16. The method according to claim 11, wherein the single-photon detection device further comprises a plurality of signal amplifiers and a low-pass filter, each of the signal amplifiers is arranged in front of one of the interference units in a transmission direction of the input signals, the low-pass filter is arranged behind the plurality of interference units in a transmission direction of the input signals, and the method further comprises:

amplifying, by the plurality of signal amplifiers, the input signals; and performing, by the low-pass filter, low-pass filtering on the output signals filtered by the plurality of interference units.

\* \* \* \* \*